United States Patent
Kinstle et al.

(10) Patent No.: US 10,048,729 B2
(45) Date of Patent: Aug. 14, 2018

(54) SERVER WITH HEAT PIPE COOLING

(71) Applicant: HEWLETT PACKARD ENTERPRISE DEVELOPMENT LP, Houston, TX (US)

(72) Inventors: Robert Michael Kinstle, Livermore, CA (US); Kevin Schlichter, Livermore, CA (US); Seitu Barron, Newark, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/215,009

(22) Filed: Jul. 20, 2016

(65) Prior Publication Data

US 2017/0017278 A1    Jan. 19, 2017

Related U.S. Application Data

(63) Continuation of application No. 13/931,813, filed on Jun. 29, 2013, now Pat. No. 9,426,932.

(Continued)

(51) Int. Cl.
*H05K 7/20*    (2006.01)
*G06F 1/20*    (2006.01)

(52) U.S. Cl.
CPC ............ *G06F 1/20* (2013.01); *H05K 7/20154* (2013.01); *H05K 7/20336* (2013.01); *H05K 7/20436* (2013.01); *H05K 7/20809* (2013.01)

(58) Field of Classification Search
CPC ............. H05K 7/20836; H05K 7/2079; H05K 7/20809; H05K 7/20772; H05K 7/20745;
(Continued)

(56) References Cited

U.S. PATENT DOCUMENTS 1,853,428 A    4/1932    Jackson
3,184,645 A    5/1965    Schaeffer
(Continued)

FOREIGN PATENT DOCUMENTS

DE    3316978 A1    11/1984
FR    2610471 A1    8/1988
GB    2124432 A     2/1984

OTHER PUBLICATIONS

US 6,491,274, 09/1987, Matouk et al. (withdrawn).
(Continued)

*Primary Examiner* — James Wu
*Assistant Examiner* — Michael Matey
(74) *Attorney, Agent, or Firm* — Hewlett Packard Enterprise Patent Department

(57) ABSTRACT

A server includes a tray that has a front portion and a back portion. A motherboard is disposed in the front portion of the tray and the motherboard is coupled to a heat sink. A fan is disposed in the back portion of the tray. A hard drive is disposed between the motherboard and the fan and the hard drive is operatively connected to the motherboard. The server also includes a heat pipe that has a body longitudinally bounded by an inlet and an outlet. The inlet is coupled to the heat sink, while the outlet is coupled to the fan. The body of the heat pipe extends past the hard drive. A power supply is also disposed in the tray and is operatively connected to the motherboard, the fan, and the hard drive.

20 Claims, 3 Drawing Sheets

Related U.S. Application Data

(60) Provisional application No. 61/780,770, filed on Mar. 13, 2013.

(58) Field of Classification Search
 CPC .......... H05K 7/20781; H05K 7/20827; H05K 7/20763; H05K 7/20709; H05K 7/1497; H05K 7/1489; H05K 7/20318; H05K 7/20336; H05K 7/20; H05K 7/20263; H05K 7/20736; H05K 13/00; H05K 7/00; H05K 7/1492; H05K 7/20145; H05K 7/20281; H05K 7/2039; H05K 7/20627; H05K 7/20727; H05K 7/20754; H05K 7/20818; H05K 9/0001; H05K 13/0023; H05K 7/1487; H05K 7/20254; H05K 7/2029; H05K 7/20327; H05K 7/20654; Y10T 29/4935; Y10T 29/49359; Y10T 29/49002; Y10T 29/49117
 See application file for complete search history.

(56) References Cited

U.S. PATENT DOCUMENTS

| | | | |
|---|---|---|---|
| 4,447,856 A | 5/1984 | Takahashi et al. |
| 4,644,443 A | 2/1987 | Swensen et al. |
| 4,672,509 A | 6/1987 | Speraw |
| 4,691,274 A | 9/1987 | Barrus |
| 4,702,154 A | 10/1987 | Dodson |
| 4,728,160 A | 3/1988 | Mondor et al. |
| 4,754,397 A | 6/1988 | Ferchau |
| 4,774,631 A | 9/1988 | Okuyama et al. |
| 4,860,163 A | 8/1989 | Sarath |
| 4,901,200 A | 2/1990 | Mazura |
| 4,911,231 A | 3/1990 | Horne |
| 4,977,532 A | 12/1990 | Borkowicz |
| 5,031,075 A | 7/1991 | Casanova et al. |
| D319,225 S | 8/1991 | Kline et al. |
| 5,038,308 A | 8/1991 | Le et al. |
| 5,069,274 A | 12/1991 | Haslett et al. |
| 5,101,320 A | 3/1992 | Bhargava et al. |
| 5,107,398 A | 4/1992 | Bailey |
| 5,136,464 A | 8/1992 | Ohmori |
| 5,216,579 A | 6/1993 | Basara et al. |
| 5,227,957 A | 7/1993 | Deters |
| D350,333 S | 9/1994 | Sharp |
| 5,351,176 A | 9/1994 | Oliver |
| 5,398,159 A | 3/1995 | Andersson et al. |
| 5,398,161 A | 3/1995 | Roy |
| 5,410,448 A | 4/1995 | Barker, III et al. |
| 5,412,534 A | 5/1995 | Cutts et al. |
| 5,432,674 A | 7/1995 | Hardt |
| 5,440,450 A | 8/1995 | Lau et al. |
| 5,450,285 A | 9/1995 | Schlemmer |
| 5,460,441 A | 10/1995 | Hastings et al. |
| 5,466,059 A | 11/1995 | Liu |
| 5,497,288 A | 3/1996 | Otis et al. |
| 5,505,533 A | 4/1996 | Kammersgard et al. |
| 5,515,239 A | 5/1996 | Kamerman et al. |
| 5,528,454 A | 6/1996 | Niklos |
| 5,544,012 A | 8/1996 | Koike |
| 5,571,256 A | 11/1996 | Good et al. |
| 5,587,877 A | 12/1996 | Ryan et al. |
| 5,596,483 A | 1/1997 | Wylar |
| 5,602,721 A | 2/1997 | Slade et al. |
| 5,646,823 A | 7/1997 | Amori |
| 5,684,671 A | 11/1997 | Blewett |
| 5,684,674 A | 11/1997 | Yin |
| 5,691,883 A | 11/1997 | Nelson |
| 5,726,866 A | 3/1998 | Allen |
| 5,751,549 A | 5/1998 | Eberhardt et al. |
| 5,788,347 A | 8/1998 | Rabinovitz |
| 5,793,608 A | 8/1998 | Winick et al. |
| 5,793,610 A | 8/1998 | Schmitt et al. |
| 5,793,616 A | 8/1998 | Aubuchon et al. |
| 5,796,580 A | 8/1998 | Komatsu et al. |
| 5,800,258 A | 9/1998 | Knoop |
| 5,808,871 A | 9/1998 | Rosecan et al. |
| 5,813,243 A | 9/1998 | Johnson et al. |
| 5,822,182 A | 10/1998 | Scholder et al. |
| 5,875,965 A | 3/1999 | Lee |
| 5,896,273 A | 4/1999 | Varghese et al. |
| 5,909,357 A | 6/1999 | Orr |
| 5,935,227 A | 8/1999 | Phan |
| 5,947,570 A | 9/1999 | Anderson et al. |
| 5,949,646 A | 9/1999 | Eberhardt et al. |
| 5,956,227 A | 9/1999 | Kitaoka |
| D415,738 S | 10/1999 | Ito et al. |
| 5,971,506 A | 10/1999 | Dubin |
| 5,992,953 A | 11/1999 | Rabinovitz |
| 5,999,365 A | 12/1999 | Hasegawa |
| 6,000,464 A | 12/1999 | Scafidi et al. |
| 6,018,456 A | 1/2000 | Young et al. |
| 6,018,458 A | 1/2000 | Delia et al. |
| 6,024,165 A | 2/2000 | Melane et al. |
| 6,025,989 A | 2/2000 | Ayd |
| 6,034,868 A | 3/2000 | Paul |
| 6,052,276 A | 4/2000 | Do et al. |
| 6,058,009 A | 5/2000 | Hood, III |
| 6,078,503 A | 6/2000 | Gallagher et al. |
| 6,081,425 A | 6/2000 | Cheng |
| 6,088,224 A | 7/2000 | Gallagher et al. |
| 6,098,131 A | 8/2000 | Unger et al. |
| 6,106,687 A | 8/2000 | Edelstein |
| 6,114,622 A | 9/2000 | Draegar |
| 6,115,250 A | 9/2000 | Schmitt |
| 6,129,429 A | 10/2000 | Allen |
| 6,134,107 A | 10/2000 | Buller et al. |
| 6,134,667 A | 10/2000 | Suzuki et al. |
| 6,141,213 A | 10/2000 | Antonuccio et al. |
| 6,147,862 A | 11/2000 | Ho |
| 6,163,454 A | 12/2000 | Strickler |
| 6,185,098 B1 | 2/2001 | Benavides |
| 6,195,262 B1 | 2/2001 | Bodette et al. |
| 6,195,493 B1 | 2/2001 | Bridges |
| 6,208,522 B1 | 3/2001 | Manweiller et al. |
| 6,255,583 B1 | 7/2001 | Johnson et al. |
| 6,259,605 B1 | 7/2001 | Schmitt |
| 6,304,443 B1 | 10/2001 | Chou |
| 6,305,180 B1 | 10/2001 | Miller et al. |
| 6,313,988 B1 | 11/2001 | Pham |
| 6,356,435 B1 | 3/2002 | Davis |
| 6,412,292 B2 | 7/2002 | Spinazzola et al. |
| 6,437,980 B1 | 8/2002 | Casebolt |
| 6,494,050 B2 | 12/2002 | Spinazzola et al. |
| 6,496,366 B1 | 12/2002 | Coglitore et al. |
| 6,504,717 B1 | 1/2003 | Heard |
| 6,504,718 B2 | 1/2003 | Wu |
| 6,506,111 B2 | 1/2003 | Sharp et al. |
| 6,523,918 B1 | 2/2003 | Baiza |
| 6,525,935 B2 | 2/2003 | Casebolt |
| 6,535,382 B2 | 3/2003 | Bishop et al. |
| 6,557,357 B2 | 5/2003 | Spinazzola et al. |
| D475,705 S | 6/2003 | Coglitore et al. |
| 6,574,104 B2 | 6/2003 | Patel et al. |
| 6,616,524 B2 | 9/2003 | Storck, Jr. et al. |
| 6,639,794 B2 | 10/2003 | Olarig et al. |
| 6,643,123 B2 | 11/2003 | Hartel et al. |
| 6,650,535 B1 | 11/2003 | Moss |
| 6,667,891 B2 | 12/2003 | Coglitore et al. |
| 6,741,467 B2 | 5/2004 | Coglitore et al. |
| 6,795,314 B1 | 9/2004 | Arbogast |
| 6,819,563 B1 | 11/2004 | Chu et al. |
| 6,822,859 B2 | 11/2004 | Coglitore et al. |
| 6,829,141 B2 | 12/2004 | Garnett |
| 6,840,304 B1 * | 1/2005 | Kobayashi ............. B01D 3/007 165/104.25 |
| 6,847,524 B2 | 1/2005 | Tomioka |
| 6,848,989 B2 | 2/2005 | Miyazaki et al. |
| 6,850,408 B1 | 2/2005 | Coglitore et al. |
| 6,867,966 B2 | 3/2005 | Smith et al. |
| 6,867,967 B2 | 3/2005 | Mok |
| 6,876,164 B2 | 4/2005 | Liu |
| 6,878,874 B2 | 4/2005 | Osborn |

(56) References Cited

U.S. PATENT DOCUMENTS

| | | | |
|---|---|---|---|
| 6,927,980 B2 | 8/2005 | Fukuda et al. | |
| 7,068,509 B2 | 6/2006 | Bash et al. | |
| 7,108,051 B2 | 9/2006 | Hung | |
| 7,123,477 B2 | 10/2006 | Coglitore et al. | |
| 7,173,821 B2 | 2/2007 | Coglitore | |
| 7,209,352 B2 | 4/2007 | Chen | |
| 7,236,370 B2 | 6/2007 | Coglitore | |
| 7,286,345 B2 | 10/2007 | Casebolt | |
| 7,369,406 B2 | 5/2008 | Matsushima | |
| 7,397,662 B2* | 7/2008 | Oyamada | H05K 7/20572 165/80.4 |
| 7,436,663 B2 | 10/2008 | Matsushima | |
| 7,499,273 B2 | 3/2009 | Casebolt | |
| 7,500,911 B2 | 3/2009 | Johnson et al. | |
| 7,508,663 B2 | 3/2009 | Coglitore | |
| 7,535,707 B2 | 5/2009 | Seibold | |
| 7,650,533 B1 | 1/2010 | Saxena et al. | |
| 7,719,837 B2* | 5/2010 | Wu | G06F 1/183 165/104.26 |
| 7,768,780 B2 | 8/2010 | Coglitore | |
| 8,787,014 B2 | 7/2014 | Zhang | |
| 9,426,932 B2 | 8/2016 | Kinstle | |
| 9,612,920 B2 | 4/2017 | Sygulla | |
| 2002/0075656 A1 | 6/2002 | Hastings et al. | |
| 2002/0126449 A1 | 9/2002 | Casebolt | |
| 2002/0173266 A1 | 11/2002 | Sharp et al. | |
| 2002/0173267 A1 | 11/2002 | Sharp et al. | |
| 2003/0035268 A1 | 2/2003 | Coglitore et al. | |
| 2003/0133266 A1 | 7/2003 | Behl | |
| 2003/0198018 A1 | 10/2003 | Cipolla et al. | |
| 2004/0004813 A1 | 1/2004 | Coglitore et al. | |
| 2004/0070936 A1 | 4/2004 | Coglitore et al. | |
| 2004/0085727 A1 | 5/2004 | Kim | |
| 2004/0114323 A1 | 6/2004 | Mok | |
| 2004/0228087 A1 | 11/2004 | Coglitore | |
| 2005/0030711 A1 | 2/2005 | Tsai | |
| 2005/0047098 A1 | 3/2005 | Garnett et al. | |
| 2005/0068716 A1 | 3/2005 | Pereira | |
| 2005/0103480 A1* | 5/2005 | Pokharna | H01L 23/427 165/122 |
| 2005/0168938 A1 | 8/2005 | Bash | |
| 2005/0168945 A1 | 8/2005 | Coglitore | |
| 2005/0170770 A1 | 8/2005 | Johnson et al. | |
| 2005/0218869 A1 | 10/2005 | Casebolt | |
| 2008/0024988 A1* | 1/2008 | Suzuki | F28F 3/025 361/699 |
| 2009/0116183 A1* | 5/2009 | Mundt | G06F 1/20 361/679.46 |
| 2010/0124012 A1* | 5/2010 | Kondo | H05K 7/20818 361/679.47 |
| 2010/0161558 A1 | 6/2010 | Goldberg et al. | |
| 2011/0078657 A1 | 3/2011 | Okada | |
| 2011/0100608 A1 | 5/2011 | Huang et al. | |
| 2011/0203777 A1 | 8/2011 | Zhao et al. | |
| 2011/0247348 A1* | 10/2011 | Mashiko | H05K 7/2079 62/62 |
| 2013/0085999 A1 | 4/2013 | Tung et al. | |
| 2013/0110961 A1 | 5/2013 | Jadhav | |
| 2013/0141863 A1* | 6/2013 | Ross | G11B 33/128 361/679.33 |
| 2013/0147503 A1* | 6/2013 | Kamath | G06F 1/20 324/750.14 |
| 2013/0168050 A1 | 7/2013 | Chauhan et al. | |
| 2013/0168058 A1* | 7/2013 | Chamseddine | G06F 1/203 165/104.26 |
| 2014/0085808 A1* | 3/2014 | Tung | H05K 7/20736 361/679.47 |
| 2014/0268550 A1 | 9/2014 | Kinstle | |
| 2014/0268551 A1 | 9/2014 | Van Pelt | |
| 2014/0268552 A1 | 9/2014 | Provenzale | |
| 2014/0268553 A1 | 9/2014 | Van Pelt | |
| 2014/0279919 A1 | 9/2014 | Sygulla | |
| 2015/0316965 A1* | 11/2015 | Ma | G06F 1/20 361/679.47 |

OTHER PUBLICATIONS

3Com Corporation. "NETBuilder II 3C6023 Token Ring Module," located at <http://www.all3com.com/cart/3c6023.html> last visited on May 9, 2003 (1 page).

3Com Corporation. "NETBuilder II 4-Slot Chassis," located at <http://www.all3com.com/cart/3c6000.html> last visited on May 9, 2003 (1 page).

3Com Corporation. "NETBuilder II 8-Slot Chassis," located at <http://www.all3com.com/cart/3c6001.html> last visited on May 9, 2003 (1 page).

3Com Corporation. "NETBuilder II CEC 12 Meg. Module PWA," located at <http://www.all3com.com/cart/3c6010.html> last visited on May 9, 2003 (1 page).

3Com Corporation. "NETBuilder II CEC 12 Meg. Module PWA," located at <http://www.all3com.com/cart/3c6010a.html> last visited on May 9, 2003 (1 page).

3Com Corporation. "NETBuilder II CEC 8MB Memory Expansion," located at <http://www.all3com.com/cart/3c6011.html> last visited on May 9, 2003 (1 page).

3Com Corporation. "NETBuilder II CEC-Star 20MB Module," located at <http://www.all3com.com/cart/3c6012html> last visited on May 9, 2003 (1 page).

3Com Corporation. "NETBuilder II CEC-Star 20 MB Module," located at <http://www.all3com.com/cart/3c6012a.html> last visited on May 9, 2003 (1 page).

3Com Corporation. "NETBuilder II DPE Plus 80MB Module," located at <http://www.all3com.com/cart/3c6091a.html> last visited on May 9, 2003 (1 page).

3Com Corporation. "NETBuilder II Dual-Processor Engine 40 MB Module," located at <http://www.all3com.com/cart/3c6090.html> last visited on May 9, 2003 (1 page).

3Com Corporation. "NETBuilder II Dual-Processor Engine plus Module," located at <http://www.all3com.com/cart/3c6091.html> last visited on May 9, 2003 (1 page).

3Com Corporation. "NETBuilder II Ethernet Module, AUI or BNC," located at <http://www.all3com.com/cart/3c6021.html> last visited on May 9, 2003 (1 page).

3Com Corporation. "NETBuilder II Ethernet with AUI Module, No BNC," located at <http://www.all3com.com/cart/3c6062.html> visited on May 9, 2003 (1 page).

3Com Corporation. "NETBuilder II Fast Ethernet 100Base-FX Module—Fiber," located at <http://www.all3com.com/cart/3c6071.html> visited on May 9, 2003 (1 page).

3Com Corporation. "NETBuilder II Fast Ethernet 100Base-TX Module—RJ-45," located at <http://www.all3com.com/cart/3c6070.html> visited on May 9, 2003 (1 page).

3Com Corporation. "NETBuilder II FDDI SingleMode Module," located at <http://www.all3com.com/cart/3c6050a.html> visited on May 9, 2003 (1 page).

3Com Corporation. "NETBuilder II FDDILink Module—Multimode-multimode," located at <http://www.all3com.com/cart/3c6055.html> visited on May 9, 2003 (1 page).

3Com Corporation. "NETBuilder II Flash for 8 Slot Extended Chassis," located at <http://www.all3com.com/cart/3c6082a.html> visited on May 9, 2003 (1 page).

3Com Corporation. "NETBuilder II HSS 3-Port RS-449 Module," located at <http://www.all3com.com/cart/3c6042.html> visited on May 9, 2003 (1 page).

3Com Corporation. "NETBuilder II HSS 4 Port WAN Module," located at <http://www.all3com.com/cart/3c6047.html> visited on May 9, 2003 (1 page).

3Com Corporation. "NETBuilder II HSS 4 Port WAN Module," located at <http://www.all3com.com/cart/3c6047a.html> vistied on May 9, 2003 (1 page).

3Com Corporation. "NETBuilder II HSS 8 Port BRI U Module," located at <http://www.all3com.com/cart/3c6045.html> visited on May 9, 2003 (1 page).

3Com Corporation. "NETBuilder II HSS G.703 Module," located at <http://www.all3com.com/cart/3c6025.html> visited on May 9, 2003 (1 page).

(56) References Cited

OTHER PUBLICATIONS

3Com Corporation. "NETBuilder II HSS RS-232 3 Port Module," located at <http://www.all3com.com/cart/3c6041a.html> visted on May 9, 2003 (1 page).
3Com Corporation. "NETBuilder II HSS RS-449 Module," located at <http://www.all3com.com/cart/3c6024.html> visited on May 9, 2003 (1 page).
3Com Corporation. "NETBuilder II HSS V.35 3 Port Module," located at <http://www.all3com.com/cart/3c6040.html> visited on May 9, 2003 (1 page).
3Com Corporation. "NETBuilder II HSSI Module—OC-1<SUB>-</SUB>T3-E3 and subrates," located at <http://www.all3com.com/cart/3c6028.html> visited on May 9, 2003 (1 page).
3Com Corporation. "NETBuilder II HSS-V.35.RS-232 Module," located at <http://www.all3com.com/cart/3c6022a.html> visited on May 9, 2003 (1 page).
3Com Corporation. "NETBuilder II MP ATMLink OC-3 Multimode Module," located at <http://www.all3com.com/cart/3c6075.html> visited on May 9, 2003 (1 page).
3Com Corporation. "NETBuilder II MP Ethernet 6 Port 10Base-FL Module," located at <http://www.all3com.com/cart/3c6061.html> visited on May 9, 2003 (1 page).
3Com Corporation. "NETBuilder II MP Ethernet 6 Port 10Base-T Module," located at <http://www.all3com.com/cart/3c6060.html> visited on May 9, 2003 (1 page).
3Com Corporation. "NETBuilder II MultiMode FDDI module set," located at <http://www.all3com.com/cart/3c6020.html> visited on May 9, 2003 (1 page).
3Com Corporation. "NETBuilder II MultiMode FDDI module set," located at <http://www.all3com.com/cart/3c6020b.html> visited on May 9, 2003 (1 page).
3Com Corporation. "NETBuilder II PWA Flash Floppy Board for NetBuilder II 3C6081A," located at <http://www.all3com.com/cart/3c6027a.html> visited on May 9, 2003 (1 page).
3Com Corporation. "NETBuilder II HSS 8 Port BRI ST Module," located at <http://www.all3com.com/cart/3c6046.html> visited on May 9, 2003 (1 page).
3Com Corporation. "NETBuilder II V.35.RS-232 HSS Module," located at <http://www.all3com.com/cart/3c6022.html> visited on May 9, 2003 (1 page).
3Com Corporation. "New 3Com NETBuilder II EM AU 3C6062," located at <http://cgi.ebay.com/ws/eBayISAPI.dll?View Item&item=3045649846&category=11184> visited on Sep. 8, 2003 (1 page).
3Com Corporation. (1997). Title Unknown. Chapters 27-70, Appendices A-B, 416 pages.
3Com Corporation. (1997). Title Unknown. Chapters 31-54, Appendices A-R, 636 pages.
3Com Corporation. (Aug. 1994). "NETBuilder Ii(R) High-Speed Serial RS-449/X.21 3-Port Module Installation Guide", 23 pages.
3Com Corporation. (Aug. 1996). "NETBuilder II(R) HSS RS-232 3-Port DCE/DTE Module Installation Guide," 25 pages.
3Com Corporation. (Aug. 1997). "Installing the NETBuilder II(R) Dual Processor Engine Module," 33 pages.
3Com Corporation. (Date Unknown). "Discontinued Products List NetBuilder—(NETBuilder II, SSIINBSI, SSIINB, OCNB, NBRO)," 8 pages total.
3Com Corporation. (Date Unknown). "NETBuilder II Intelligent Routers," NETBuilder , 8 pages.
3Com Corporation. (Date Unknown). "DTE-to-DCE Adapter Release Notes," 2 pages.
3Com Corporation. (Date Unknown). "Installing the NETBuilder II Dual Processor Engine Module Image," located at <http://www.all3com.com/cart/img/3c6090<SUB>-</SUB>zoom.jpg> visited on May 9, 2003 (2 pages).
3Com Corporation. (Date Unknown). "Installing the NETBuilder II Dual Processor Engine Module Image," located at <http://www.all3com.com/cart/img/3c6091<SUB>-</SUB>zoom.jpg> visited on May 9, 2003 (2 pages).
3Com Corporation. (Dec. 1993). "NETBuilder II Dual Power Supply System Installation Guide," 26 pages.
3Com Corporation. (Dec. 1993). "NETBuilder II Dual Power Supply System Installation Guide," 61 pages.
3Com Corporation. (Dec. 1996). "NETBuilder II® Flash Memory Drive Installation Guide", 42 pages.
3Com Corporation. (Feb. 1994). "NETBuilder II® HSSI Module Installation Guide Release Notes", 35 pages.
3Com Corporation. (Jan. 1993). "NETBuilder II® High-Speed Serial V.35/RS-232 Module Installation Guide", 23 pages.
3Com Corporation. (Jan. 1994). "NETBuilder II Base System Installation Guide Release Notes", 4 pages.
3Com Corporation. (Jan. 1994). "NETBuilder II® HSSI Module Installation Guide", 28 pages.
3Com Corporation. (Jan. 1998). "Installing the NETBuilder II® HSS 4-Port WAN Module", 19 pages.
3Com Corporation. (Jan. 1998). "NETBuilder II® HSS 4-Port WAN Module Software Release Notes: Software Version 10.3", 13 pages.
3Com Corporation. (Jan. 1998). "NETBuilder II® HSS 4-Port WAN Module Software Release Notes-Software Version 10.3", 12 pages.
3Com Corporation. (Jul. 1995). "NETBuilder II® MP Ethernet 6-Port 10BASE-T and 10BASE-FL Module Installation Guide", 19 pages.
3Com Corporation. (Jun. 1995). "NETBuilder II® Fast Ethernet 100BASE-TX/100BASE-FX Module Installation Guide", 25 pages.
3Com Corporation. (Jun. 1996). "NETBuilder II(R) Communications Engine Card (CEC20) Module Installation Guide", 34 pages.
3Com Corporation. (Jun. 1996). "NETBuilder II® Communications Engine Card (CEC20) Module Installation Guide", 29 pages.
3Com Corporation. (Mar. 1992). "NETBuilder II® Ethernet Module Installation Guide", 21 pages.
3Com Corporation. (Mar. 1993). "NETBuilder II® High-Speed Serial RS-449 Module Installation Guide", 24 pages.
3Com Corporation. (Mar. 1993). "NETBuilder II(R) High Speed Serial G.703 Module Installation Guide", 19 pages.
3Com Corporation. (Mar. 1995). "NETBuilder II® CEC Memory Expansion Installation Guide", 7 pages.
3Com Corporation. (May 1997). "Approved Flash Memory and DRAM for the NETBuilder II® DPe Module", 1 page.
3Com Corporation. (May 1997). "Installing the NETBuilder II® Bridge/Router: For EZ Built Systems and Base Chassis", 81 pages.
3Com Corporation. (May 1997). "Installing the NETBuilder II® Dual Processor Engine Module: For Models DPE 40 and DPE 80", 29 pages.
3Com Corporation. (May 1997). "NETBuilder II® Hardware Installation Guides", 12 pages.
3Com Corporation. (May 2003). "Installing the NETBuilder II Bridge/Router", 45 pages.
3Com Corporation. (Oct. 1997). "New Installation for NETBuilder II® Software: Software Version 10.1.", 70 pages.
Anonymous, "Cobalt RaQ 2," located at <http://www.cobalt.com/products/pdfs/datasheet.rag2.pdf>, last visited on Nov. 27, 2000, 2 pages.
Anonymous, "Cobalt RaQ 3,"located at <http://www.cobalt.com/products/pdfs/datasheet.rag3.pdf>, last visited on Nov. 27, 2000, 2 pages.
Anonymous, "Cobalt RaQ 4,"located at <http://www.cobalt.com/products/pdfs/datasheet.rag4.pdf>, last visited on Nov. 27, 2000, 2 pages.
Anonymous, "SGI—O2 Workstation Product Overview," located at <http://www.sgi.com/02/overview.html>, last visited on Sep. 8, 2000, 4 pages.
Anonymous. "A Rack-Mountable Web Server for ISPs of All Sizes," located at http://www.sgi.com/solutions/internet/products/rackmount.html <http://www.sgi.com/solutions/internet/products/rachmoun.html>, last visited on Jan. 6, 2000, 4 pages.
Anonymous. (Mar. 10, 1988). "Silicon Graphics Unveils Dedicated, Entry-Level Hosting Solution," Press Release, located at <http://www.sgi.com/newsroom/press_releases/1998/march/o2webserver_release.html>, last visited on Jan. 6, 2000, 2 pages.

(56) References Cited

OTHER PUBLICATIONS

Anonymous. (Monday, Apr. 24, 2000). "Rackmount Solutions," San Jose Mercury News Business Section, 1 page.
Anderson, R.D. et al. (Feb. 1972). "Volatile Memory Data Retention," IBM Technical Disclosure Bulletinpp. 2712-2713, located <http://www.delphion.com/tdb?order=72C+00474>visited on Nov. 18, 2005 (2 pages).
Argento, C.W. et al. (Jun. 1996). "Forced Convection Air-Cooling of a Commerical Electronic Chassis: An Experimental and Computational Case Study," IEEE Transactions on Components, Packaging, and Manufacturing Technology—Part A19(2):248-257.
Artecon, Inc. (Mar. 26, 1997). "Artecon Announces Industry's Highest Performing RAID System for Small Networks; LynxArray Series 3000 Offers Fault Tolerance, True Scalability, Hot-Swap Components," Business Wire(Press Release), 2 pages.
Author Unknown. (Jul. 26, 1999). "New Products," Electronic Design, 3 pages.
Baker, D.L. et al. (Jan. 1990). "Rack-Mounted Computer System," IBM Technical Disclosure Bulletin, pp. 258-259.
Bay Networks, Inc. (Date Unknown). "Bay Networks Accelar-Supports Management Module SM-BAY 1002", Spectrum Enterprise Manager, Device, Management, Cabletron Systems, 71 pages.
Bay Networks, Inc. (Dec. 1997). "Using the Accelar 1200/1250 Routing Switch", 80 pages.
Bay Networks, Inc. (Dec. 1997). "Release Notes for the Accelar 1000 Series Products-Release 1.0", 18 pages.
Bay Networks, Inc. (Jun. 1998). "Release Notes for the Accelar 1000 Series Products-Software Release 1.1.1", 60 pages.
Bay Networks, Inc. (Nov. 1997). "Accelar 1200 Routing Switch", Strategic Networks, 9 pages.
Bay Networks, Inc. (Sep. 1998). "Release Notes for the Accelar 1000 Series Products-Software Release 1.3", 56 pages.
Bay Networks, Inc. (Sep. 1998). "Using the Accelar 1200/1250 Routing Switch", 94 pages.
Brown et al. (Sep. 1989). "Accessible Interconnect for Rack-Mounted Processor Module-to-Module Logic Signal Communication," IBM Technical Disclosure Bulletin, pp. 276-277.
Cisco Systems, Inc. (Jan. 17, 1994). "News Release: Cisco Adds Four Remote Access Routers," News Release, 29 pages.
COL Computer Online, "HP ProCurve Routing Switch 9308M," located at <http://www.gotocol.com/hp9308m.html> visited on Mar. 6, 2006. (3 pages).
David Systems, Inc. (1988). David CO-NET Technical Reference Manual David Systems, Inc.: Sunnyvale, CA, 162 pages.
David Systems, Inc. (Oct. 1984-Nov. 1986). "Selected Press Articles", David Systems, Inc.: Sunnyvale, CA, 133 pages.
Dax Systems, Inc. (Aug. 9, 1996). "Dax Systems Serves up Rack Mount Solution for Intel Multi-processor," Business Wire(Press Release). 2 pages.
Electronic Technology Group, Inc. (Jul. 8, 1994). "ETG Announces Release of New Raidmaster Disk Array Subsystem," PR Newswire (Press Release), 2 pages.
European Telecommunication Standards Institute ed. (Jan. 1994). "Equipment Engineering (EE): European Telecommunication Standard for Equipment Practice Part 3: Engineering Requirements for Miscellaneous Racks and Cabinets," ETS 300 119-3. ETSI: Valbonne, France, pp. 1-17.
Fetters, D. (Feb. 8, 1999). "Cubix High-Density Server Leads the Way With Standout Management Software," Network Computing, pp. 84-92.
Fetters, D. (Mar. 22, 1999). "Need Some Space? Have a Server Rack Attack," Network Computing, pp. 90-91.
Grigonis, R. (Feb. 1997). Dialog.RTM. Search for "Getting Under the Hood," Computer TelephonypS10, 8 pages.
Kaiser, L. et al. (1989). "Noise Control on Computer and Business Equipment using Speed Controlled Blowers," IEEE2:114-117.
Markstein, H.W. (May 1996). "Cooling Electronic Equipment Enclosures," Electronic Packaging & Production, pp. 57-63.
Nortel Networks, Inc. (Oct. 1998). "News Release," located at <http://www.nortel.com/corporate/news/newsreleases/press.sub.--10-98.h- tml> visited on Feb. 16, 2006 (10 pages total).
Nortel Networks, Inc. (Date Unknown). "Building SAP-Capable Networks-How to Turn Your Network Into a Competitive Advantage", White Paper, pp. 1-24.
Nortel Networks, Inc. (Mar. 1999). "Release Notes for the Accelar 1000 Series Products-Software Release 2.0", 39 pages.
Nortel Networks, Inc. (Mar. 1999). "Using the Accelar 1200/1250 Routing Switch", 96 pages.
Paturet, J. (May 1989). "Improved Cooling System for Rack-Mounted Equipment," IBM Technical Disclosure Bulletin, pp. 140-141, located at <http://www.delphion.com/tdbs/tdb?order=89A+60774>visited on Nov. 22, 2005.
Perlmutter, A. (Sep. 1959). "Uniform Cooling Air Flow During Computer Maintenance and Operation," IRE Transactions on Component Parts6(3):180-189.
Rezek, G. (Mar./Jun. 1966). "Suction vs. Pressure Forced Air Cooling-Part II," IEEE Transactions on Parts, Materials and Packaging 2(1/2):35-43.
Ross, G. (Feb. 1995). "Thermal Management in Racks and Cabinets," Computer Packaging Technology pp. 82-84.
Simons, R.E. (Dec. 1995). "The Evolution of IBM High Performance Cooling Technology," IEEE Transactions on Components, Packaging, and Manufacturing Technology—Part A 18(4):805-811.
Soliman, F.A. et al. (1992). "Software-Compensated Programmable Temperature Controller," Int. J. Electronics 73(1): 101-105.
The Tolly Group ed. (Mar. 1998). "Bay Networks Accelar 1200.TM. Routing Switch", the Tolly Group, pp. 1-6.
Wong, H. et al. (Dec. 1996). "Thermal Evaluation of PowerPC 620 Microprocessor in a Multiprocessor Computer," IEEE Transactions and Components, Packaging and Manufacturing Technology—Part A 19(4):469-477.
U.S. Appl. No. 13/931,813 Final Office Action dated Dec. 16, 2015.
U.S. Appl. No. 13/931,813 Office Action dated Jun. 30, 2015.
U.S. Appl. No. 13/931,814 Office Action dated Jun. 18, 2015.
U.S. Appl. No. 13/831,771 Final Office Action dated May 6, 2016.
U.S. Appl. No. 13/831,771 Office Action dated Oct. 15, 2015.
U.S. Appl. No. 11/026,163 Final Office Action dated Jul. 3, 2008.
U.S. Appl. No. 11/026,163 Office Action dated Feb. 28, 2008.
U.S. Appl. No. 11/026,163 Final Office Action dated Jan. 19, 2007.
U.S. Appl. No. 11/026,163 Office Action dated Jul. 27, 2006.
U.S. Appl. No. 11/026,163 Final Office Action dated Jan. 24, 2006.
U.S. Appl. No. 11/026,163 Office Action dated Jul. 11, 2005.
U.S. Appl. No. 11/054,031 Office Action dated Jan. 4, 2007.
U.S. Appl. No. 11/855,370 Final Office Action dated Aug. 22, 2008.
U.S. Appl. No. 11/855,370 Office Action dated Feb. 22, 2008.
U.S. Appl. No. 11/282,848 Office Action dated Jul. 9, 2008.
U.S. Appl. No. 11/282,848 Final Office Action dated Apr. 9, 2008.
U.S. Appl. No. 11/282,848 Office Action dated Dec. 7, 2007.
U.S. Appl. No. 11/764,551 Office Action dated Sep. 8, 2009.
U.S. Appl. No. 10/815,422 Office Action dated Oct. 5, 2005.
U.S. Appl. No. 15/442,458, filed Feb. 24, 2017, John M. Sygulla, Hierarchical System Manager Rollback.

\* cited by examiner

SERVER WITH HEAT PIPE COOLING

CROSS REFERENCE TO RELATED APPLICATIONS

This application is a continuation and claims the priority benefit of U.S. patent application Ser. No. 13/931,813 filed Jun. 29, 2013, which claims the priority benefit of U.S. provisional application 61/780,770 filed Mar. 13, 2013, the disclosures of which are incorporated herein by reference.

BACKGROUND OF THE INVENTION

As companies create and process more and more data, the data storage systems required to handle the data must provide faster data access and higher data storage capacities. Data storage systems are implemented in data centers having large numbers of servers in rack-mount trays. The servers manage access to centralized resources or services in a network. The data centers house several servers at the same time, often storing each server in chassis, such as a tray or blade. Several trays are commonly stored in a single cabinet, and a plurality of cabinets are often arranged in rows separated by an aisle.

As a server's processing power increases, so does the heat that is radiated from server processors and other circuitry. Heat can damage various components within a chassis, such as temperature sensitive hard drives, that have a specific temperature window for optimal operation. Extremely high temperatures in certain service aisles can create health risks for data center employees that must enter the aisles to manage cables, fix connection issues or perform other tasks such as routine maintenance. The Occupational Safety and Health Administration (OSHA) enforces regulations that prevent data center employees from working in environments that exceed a certain temperature.

Servers of the prior art typically feature input/output (I/O) terminals that face into the hot aisle. Such servers do so because they lack the ability to be turned around so that their I/O terminals face into the cold aisle (i.e., to allow data center employees to work in the cold aisle rather than the hot aisle). When a server of the prior art is simply turned around such that its I/O terminals face into the cold aisle, the motherboard must also be located next to the cold aisle due to inherent connector limitations. The motherboard cannot simply be positioned downstream from the temperature sensitive devices because doing so places the motherboard too far from the I/O terminals. Accordingly, turning the chassis around places the temperature sensitive device downstream from the heat-generating motherboard. When air is passed through the chassis to exhaust the heat into the hot aisle, the hot air radiating from the motherboard is carried into contact with the hard drive or other temperature sensitive device.

The air may be blown into the server by a computer room air conditioner (CRAG) or computer room air handler (CRAH). The air may also be directed into the server by one or more externals fans that are located outside of the server tray and face into the chassis. Alternatively, rather than being blown through the chassis, the air may be drawn through the chassis by a fan located at its rear. In any such configuration, temperature sensitive devices are exposed dangerously high temperatures that can cause them to fail.

Given these shortcomings in the art, there is a need in the art for servers with improved cooling systems that increase cooling efficiencies while reducing heat exposure for sensitive components and data center employees.

SUMMARY OF THE CLAIMED INVENTION

Heat pipes are utilized in a server tray to transport heat from high radiating devices around and/or away from temperature sensitive devices. The heat pipes may provide the heat to a heat sink, radiator, fan, or other device in the rear of the server tray. The server tray includes a front portion and a back portion. A motherboard is disposed in the front portion of the tray and is coupled to a heat sink. A fan is disposed in the back portion of the tray, and a hard drive is disposed between the motherboard and the fan. The hard drive may be connected to the motherboard. The server tray includes one or more heat pipes that have a body longitudinally bounded by an inlet and an outlet. The inlet may be coupled to the heat sink, while the outlet is coupled to the fan. The body of the heat pipe extends past the hard drive or other components sensitive to heat.

DETAILED DESCRIPTION

A server tray with an improved cooling system utilizing heat pipes is provided. Heat pipes are utilized in a server tray to transport heat from high radiating devices around and/or away from temperature sensitive devices. The heat pipes carry the heat from a heat sink to a radiator in the rear of the server tray.

The server may manage access to centralized resources or services in a network. The server may be stored in a data center. Although data centers are discussed herein for illustrative purposes, the present technology may be useful for other entities as well.

Figure 1:
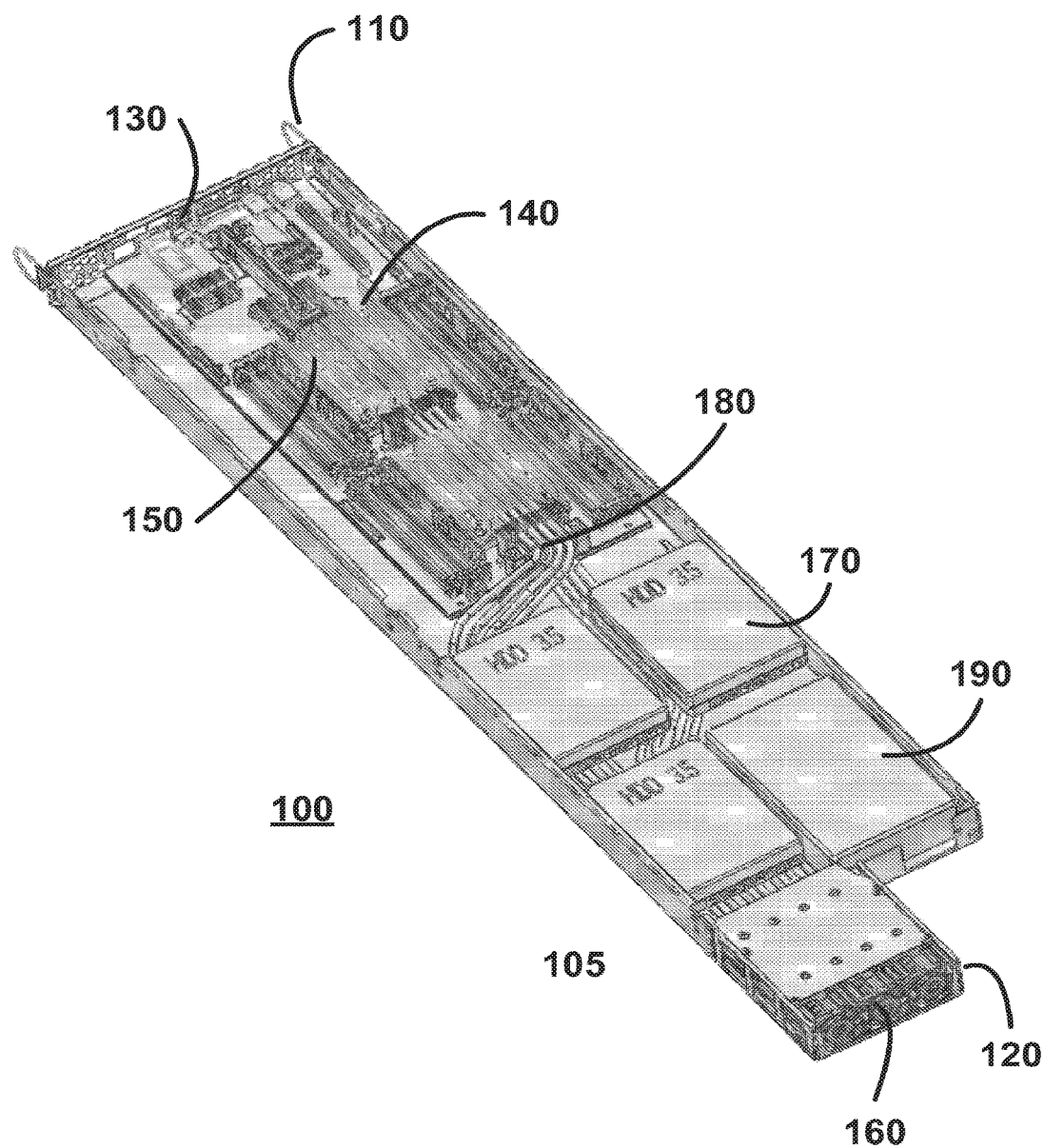
FIG. 1 is a perspective view of an exemplary server tray in accordance with the presently claimed invention.

As described below in further detail, the present invention allows the hard drive and other sensitive components to be ventilated and cooled without exposing them to dangerously hot air. The presently claimed invention does so by allowing the I/O terminals to face into the cold aisle and using heat pipes to transport heat from high radiating devices around and/or away from temperature sensitive devices that are downstream from the high radiating devices. Because the I/O terminals face into the cold aisle, data center employees can work in the cold aisle rather than the hot aisle. As a result, the presently claimed invention reduces safety risks to employees and allows data centers to easily comply with OSHA regulations FIG. 1 shows a perspective view of an exemplary server tray that allows its I/O terminal to face into the cold aisle rather than the hot aisle. A server tray 100 includes a tray 105 having a front portion 110 and a back portion 120. Server 100 also includes a motherboard 140 disposed in front portion 110 of tray 105. Motherboard 140 is coupled to a heat sink 150. Heat sink 150 draws heat from motherboard 140. In embodiments, the heat sink may include a copper block that holds the heat pipes to the CPU by engaging the standard heat sink mounting provisions on the motherboard.

In embodiments, heat sink 150 may be made from copper, aluminum, or any other material that provides for heat convention from the heat sink to the air between the sink prongs. The heat sink 150 may have any dimension and design that is suitable to draw a sufficient amount of heat from the motherboard. A fan 160 is disposed in the back portion of tray 105. A hard drive 170 is disposed between motherboard 140 and fan 160. Hard drive 170 is operatively connected to motherboard 140.

Heat pipes 180 are connected between heat sinks 150 and travel through the tray 105 to rear fan 120. As shown, the heat pipes navigate the tray so as to travel underneath or away from the hard drives 170. Heat pipes 180 are insulated to help prevent heat from affecting the temperature, and corresponding performance, of hard drives 170 and other heat sensitive devices.

Heat sink 150 is coupled to fan 160 through heat pipe 180. Server 100 may include an input/output (I/O) terminal 130 disposed in front portion 100 of tray 105. I/O terminal 130 may be operatively connected to motherboard 140. A power supply 190 may be disposed in tray 105. Power supply 190 may be operatively connected to motherboard 140, fan 160, and hard drive 170. Tray 105 may be installed in a rack (not shown) having multiple trays 105, each tray 105 having multiple hard drives 170 for storing data. Because I/O terminal 130 may face into the cold aisle rather than the hot aisle, data center employees may work on cabling or connection issues without having to withstand dangerous temperatures in the hot aisle. Accordingly, the presently claimed invention allows for significantly increased compliance with existing OSHA regulations.

Figure 2:
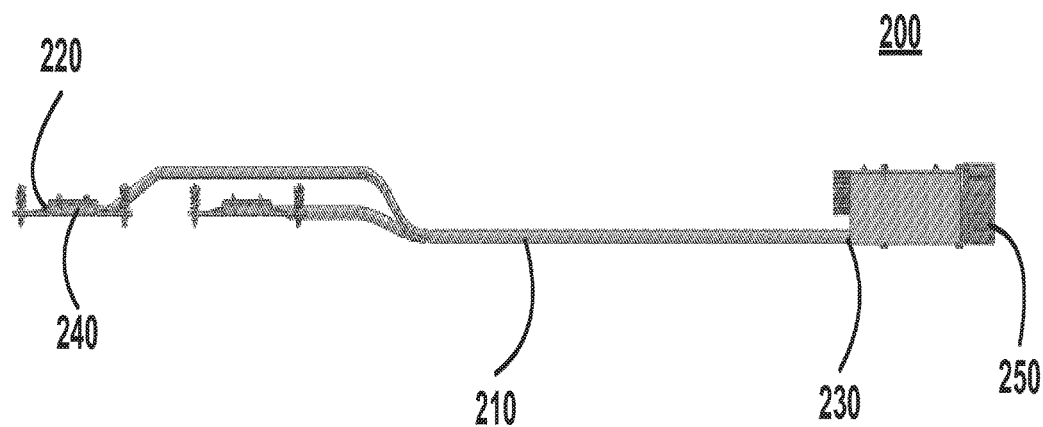
FIG. 2 is a side view of an exemplary cooling system in accordance with the presently claimed invention.
Figure 3:
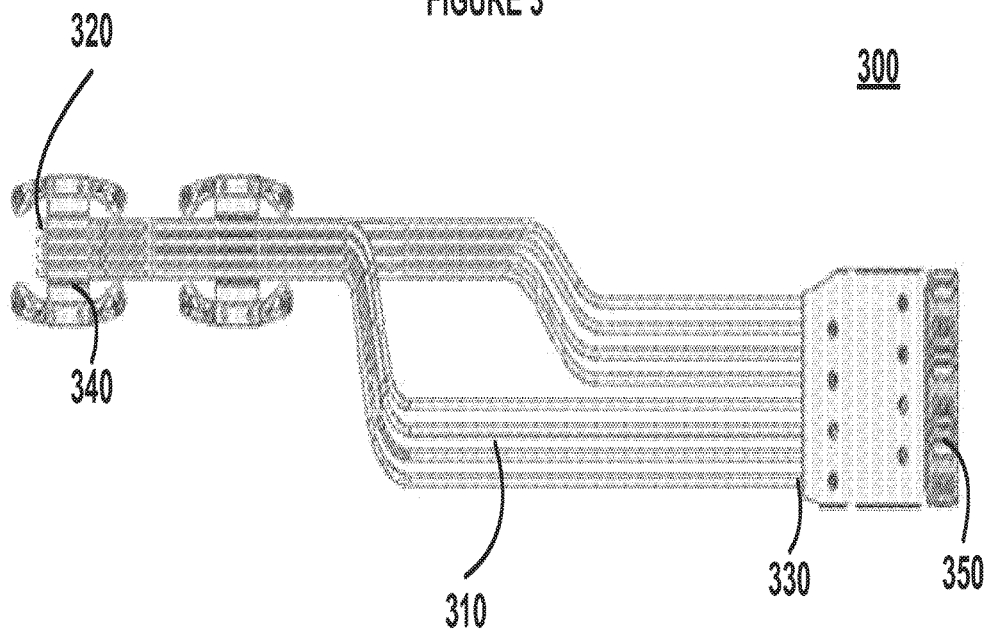
FIG. 3 is a top view of an exemplary cooling system in accordance with the presently claimed invention.

FIG. 2 shows a side view of an exemplary cooling system in accordance with the presently claimed invention. The cooling system illustrated in FIGS. 2 and 3 represent a side view and top view, respectively, of the heat pipes 180 of FIG. 1 with most of the other tray components removed. Cooling system 200 includes a heat pipe 210 having a body longitudinally bounded by an inlet 220 and an outlet 230. Heat pipe 210 may include copper or any number of other suitable materials that will be readily recognized by a person of ordinary skill in the art. Specifically, heat pipe 210 may be made with any other material that can transfer and/or conduct heat, such as silver or gold. Inlet 220 is coupled to a heat sink 240, while outlet 230 is coupled to a fan 250. The body of heat pipe 210 extends past hard drive 170 of FIG. 1 along the length of tray 105. The size and length of heat pipe 210 may be selected based on design considerations. For example, a heat pipe 210 may be selected to provide the shortest length possible between heat sink 240 and fan 250 to minimize the heat lost within the system. The present invention may be implemented with a variety of heat pipe sizes and shapes, based on the layout of the chassis, the environment in which heat pipe 210 is used, and how much heat needs to be transferred. For example, in an embodiment, the present invention may utilize four 8 mm copper heat pipes 210.

FIG. 3 is a top view of another exemplary cooling system in accordance with the presently claimed invention. Cooling system 300 may include a plurality of heat pipes 310, each having a body longitudinally bounded by an inlet 320 and an outlet 330. Inlet 320 is coupled to a heat sink 340, while outlet 330 is coupled to a fan 350. Each inlet 320 may be coupled to the same heat sink 340, or they may be coupled to multiple heat sinks 340 individually or in groups. The body of each heat pipe 310 may extend past hard drive 170 of FIG. 1 along the length of tray 105. Heat pipes 310 may be manufactured using known heating, casting, and cooling processes.

Referring back to FIG. 1, heat pipe 180 may extend past hard drive 170 while being disposed beneath hard drive 170. Heat pipe 180 may also extend past hard drive 170 while being disposed adjacent to or above hard drive 170. As persons of ordinary skill in the art will readily recognize, any number of configurations for heat pipe 180 are suitable so long as the heat generated by motherboard 140 is substantially limited from contacting hard drive 170. Because the heat radiating from motherboard 140 travels through heat pipe 180 and is exhausted out the back of tray 105 by fan 160, the hot air may be concentrated in the hot aisle without heating sensitive components like hard drive 170. I/O terminal 130 may also face into or be accessible from the cold aisle, which allows data center employees to avoid working in the hot aisle.

Because the data center employees can avoid working in the hot aisle, data centers can more easily comply with OSHA regulations that limit when a data center employee may enter the hot aisle. For example, OSHA's maximum permissible wet-bulb globe temperature (WBGT) in the hot aisle is 86 degrees Fahrenheit when doing continuous work and 90 degrees Fahrenheit with a regimen of 25% work and 75% rest. Cooling efficiencies are highest when the hot aisle is maintained at over 100 degrees Fahrenheit. The presently claimed invention allows the hot aisle to remain over 100 degrees Fahrenheit while simultaneously allowing datacenter workers to work in the cold aisle—an environment within acceptable OSHA limits. Accordingly, the presently claimed invention provides increased cooling efficiencies, reduced health risks to data center employees, and increased compliance with OSHA regulations, all while substantially mitigating heat-induced damage to hard drives and other sensitive components.

Figure 4:
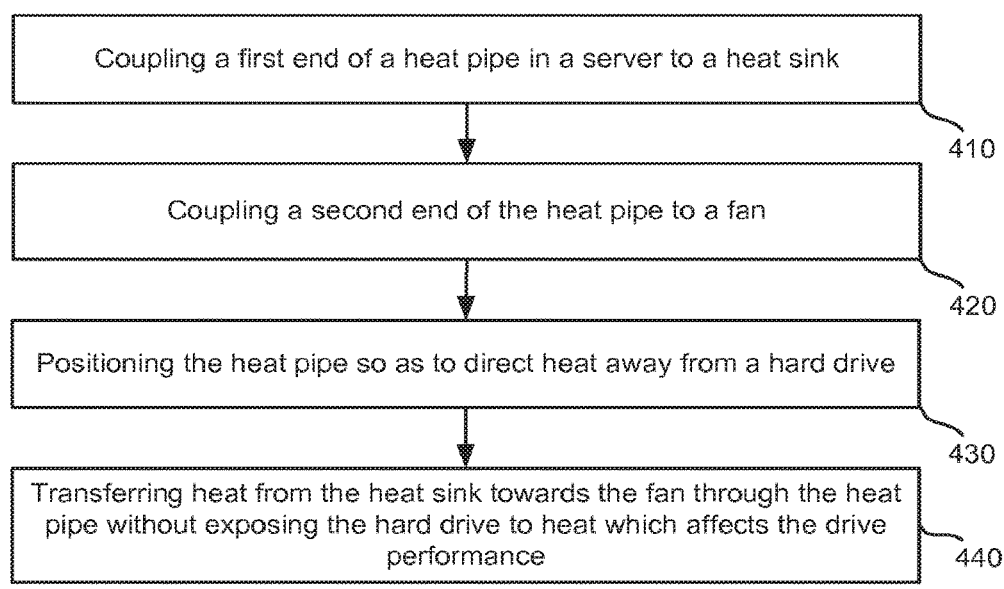
FIG. 4 is a method for cooling a server with a heat pipe.

FIG. 4 is a method for cooling a server with a heat pipe. The method of FIGURE begins with coupling a first end of the heat pipe in a server to a heat sink at step 410. The second end of the heat pipe may be coupled to a fan at step 420. The heat pipe may be positioned such that the heat pipe directs heat away from the hard drive at step 430. For example, the heat pipe may be positioned above, below or adjacent to the hard drive, but not touching the hard drive. Heat is transferred from the heat sink towards the fan through the heat pipe without exposing the hard drive to heat which affects the drive performance at step 440. It may be acceptable to expose the hard drive to a bit of radiation from the heat pipe, but the heat pipe will not be positioned such that the radiation coming off the heat pipe raises the temperature of the hard drive to a point at which performance of the hard drive may degrade.

The foregoing detailed description of the technology herein has been presented for purposes of illustration and description. It is not intended to be exhaustive or to limit the technology to the precise form disclosed. Many modifications and variations are possible in light of the above teaching. The described embodiments were chosen in order to best explain the principles of the technology and its practical application to thereby enable others skilled in the art to best utilize the technology in various embodiments and with various modifications as are suited to the particular use contemplated. It is intended that the scope of the technology be defined by the claims appended hereto.

What is claimed is:

1. A server comprising:

a motherboard disposed in a front portion of the server;

a fan disposed in a back portion of the server;

a hard disk drive disposed between the motherboard and the fan, the hard drive operatively connected to the motherboard;

a heat pipe having a body bounded longitudinally by an inlet and an outlet, the inlet coupled to a heat sink, the outlet coupled to the fan, and the body extending past the hard drive while being disposed directly beneath the hard drive, wherein the heat pipe body is fabricated from heat conducting materials that extend from the inlet to the outlet;

a power supply disposed in the server, the power supply operatively coupled to at least one electronic component of the motherboard, the fan, and the hard drive; and one or more I/O terminals disposed in the front portion of the server, wherein heat from the motherboard is drawn to the heat sink, transferred by the heat pipe away from the I/O terminals, and exhausted by the fan at the back portion of the server.

2. The server of claim 1, further comprising an insulator disposed between the heat pipe body and the disk drive.

3. The server of claim 1, further comprising one or more additional heat pipes coupled to transfer heat from one or more other electronic components of the server.

4. The server of claim 1, wherein the heat pipe extends past the hard drive while being disposed adjacent to the hard drive.

5. The server of claim 1, further comprising a tray, wherein the tray contains the motherboard, the hard drive, and the heat pipe.

6. The server of claim 5, further comprising a plurality of trays.

7. The server of claim 1, wherein the heat sink is made from a material that provides for heat convention from the heat sink to air between sink prongs.

8. The server of claim 1, wherein the heat sink includes a copper block to hold the heat pipe to a CPU.

9. The server of claim 1, further comprising a plurality of heat pipes extending between a plurality of heat sinks and the fan.

10. A method for cooling one or more electric components in a server, the method comprising:

coupling a first end of the heat pipe to at least one of a heat sink of an electronic component of a motherboard, a fan, and a hard drive, wherein a body of the heat pipe is fabricated from heat conducting materials, and wherein the first end is disposed in a front portion of the server;

coupling a second end of the heat pipe to the fan at a back portion of the server, wherein the hard drive is disposed between the electronic components and the fan, wherein the heat pipe couples heat from the first end of the heat pipe to the second end of the heat pipe, and wherein the heat pipe extends past the hard drive while being directly disposed beneath the hard drive; and disposing one or more I/O terminals in the front portion of the server, wherein heat from the motherboard is drawn to the heat sink, transferred by the heat pipe away from the I/O terminals, and exhausted by the fan at the back portion of the server.

11. The method of claim 10, wherein an insulator is disposed between the heat pipe body and the hard drive.

12. The method of claim 10, wherein one or more additional heat pipes are coupled to transfer heat from one or more other electronic components of the server.

13. The method of claim 10, wherein the heat pipe extends past the hard drive while being disposed adjacent to the hard drive.

14. The method of claim 10, wherein a tray contains the motherboard, the hard drive, and the heat pipe.

15. The method of claim 14, wherein the server includes a plurality of trays.

16. A system comprising:

a motherboard disposed in a front portion of a server;

a fan disposed in a back portion of the server;

a hard disk drive disposed between the motherboard and the fan, the hard drive operatively connected to the motherboard; and a heat pipe having a body bounded longitudinally by an inlet and an outlet, the inlet coupled to a heat sink, the outlet coupled to a fan, and the body extending past the hard drive while being disposed directly beneath the hard drive, wherein the heat pipe body is fabricated from heat conducting materials that extend from the inlet to the outlet.

17. The system of claim 16, further comprising a power supply disposed in the server.

18. The system of claim 17, wherein the power supply is operatively coupled to the motherboard, the fan, and the hard drive.

19. The system of claim 16, further comprising one or more I/O terminals disposed in the front portion of the server.

20. The system of claim 19, wherein heat from the motherboard is drawn to the heat sink, transferred by the heat pipe away from the I/O terminals, and exhausted by the fan at the back portion of the server.

* * * * *